United States Patent
Lopelli et al.

(10) Patent No.: US 11,695,372 B1
(45) Date of Patent: Jul. 4, 2023

(54) QUADRATURE VOLTAGE-CONTROLLED OSCILLATOR (QVCO) WITH IMPROVED PHASE NOISE AND QUADRATURE IMBALANCE TRADE-OFF

(71) Applicant: QUALCOMM Incorporated, San Diego, CA (US)

(72) Inventors: Emanuele Lopelli, Laguna Niguel, CA (US); Cheng-Han Wang, San Jose, CA (US); Yi Zeng, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/650,834

(22) Filed: Feb. 11, 2022

(51) Int. Cl.
*H03B 5/12* (2006.01)

(52) U.S. Cl.
CPC ............ *H03B 5/1228* (2013.01); *H03B 5/124* (2013.01); *H03B 5/1212* (2013.01); *H03B 2200/009* (2013.01); *H03B 2200/0078* (2013.01)

(58) Field of Classification Search
CPC .................................................. H03B 5/1228
USPC ...................................................... 331/117 FE
See application file for complete search history.

(56) References Cited

U.S. PATENT DOCUMENTS

| | | | |
|---|---|---|---|
| 7,199,675 B2* | 4/2007 | Lee ...................... | H03K 3/0322 |
| | | | 331/117 FE |
| 8,779,861 B2* | 7/2014 | Wang .................. | H03K 3/0315 |
| | | | 331/117 FE |
| 2011/0032044 A1* | 2/2011 | Lee ...................... | H03B 5/1296 |
| | | | 331/117 FE |

OTHER PUBLICATIONS

Andreani P., et al., "Analysis and Design of a 1.8-GHz CMOS LC Quadrature VCO", IEEE Journal of Solid-State Circuits, vol. 37, No. 12, Dec. 2002, 12 Pages.

* cited by examiner

*Primary Examiner* — Joseph Chang
(74) *Attorney, Agent, or Firm* — Patterson + Sheridan, L.L.P.

(57) ABSTRACT

Apparatus and methods for generating multiple oscillating signals. An example circuit generally includes a first voltage-controlled oscillator (VCO) circuit and a second VCO circuit having a differential bias input coupled to a differential output of the first VCO circuit. At least one of the first VCO circuit or the second VCO circuit generally includes: a pair of cross-coupled transistors comprising a first transistor and a second transistor, a first inductive element coupled between a first node and the drain of the first transistor, a second inductive element coupled between the first node and the drain of the second transistor, a third transistor having a drain coupled to the drain of the first transistor and having a source coupled to a second node, and a fourth transistor having a drain coupled to the drain of the second transistor and having a source coupled to the second node.

16 Claims, 7 Drawing Sheets

QUADRATURE VOLTAGE-CONTROLLED OSCILLATOR (QVCO) WITH IMPROVED PHASE NOISE AND QUADRATURE IMBALANCE TRADE-OFF

TECHNICAL FIELD

Certain aspects of the present disclosure generally relate to electronic circuits and, more particularly, to circuitry for generating multiple oscillating signals, such as a quadrature voltage-controlled oscillator (QVCO).

BACKGROUND

Wireless communication networks are widely deployed to provide various communication services such as telephony, video, data, messaging, broadcasts, and so on. A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

In order to transmit or receive data and/or control information, the radio frequency front end of the base station and/or the mobile station may include one or more frequency synthesizers to generate oscillating signals used for upconverting baseband signals and downconverting radio frequency (RF) signals. At least one of the frequency synthesizers may include a voltage-controlled oscillator (VCO) for tuning an oscillating signal to different frequencies. In some cases, quadrature local oscillators (LOs) may be utilized to drive mixers in in-phase/quadrature (IQ)-based radios. One way by which quadrature oscillating signals may be generated is through the use of a quadrature VCO (QVCO).

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to techniques and apparatus for generating multiple oscillating signals.

Certain aspects provide a circuit for generating oscillating signals. The circuit generally includes a first voltage-controlled oscillator (VCO) circuit and a second VCO circuit having a differential bias input coupled to a differential output of the first VCO circuit. At least one of the first VCO circuit or the second VCO circuit generally includes a pair of cross-coupled transistors comprising a first transistor and a second transistor, wherein the first transistor has a gate coupled to a drain of the second transistor and wherein the second transistor has a gate coupled to a drain of the first transistor; a first inductive element coupled between a first node and the drain of the first transistor; a second inductive element coupled between the first node and the drain of the second transistor; a third transistor having a drain coupled to the drain of the first transistor and having a source coupled to a second node; and a fourth transistor having a drain coupled to the drain of the second transistor and having a source coupled to the second node.

Certain aspects provide a method for generating a plurality of oscillating signals. The method generally includes generating a first oscillating signal with a first VCO circuit, biasing a second VCO circuit with the first oscillating signal, and generating a second oscillating signal with the second VCO circuit. At least one of the first VCO circuit or the second VCO circuit generally includes a pair of cross-coupled transistors comprising a first transistor and a second transistor, wherein the first transistor has a gate coupled to a drain of the second transistor and wherein the second transistor has a gate coupled to a drain of the first transistor; a first inductive element coupled between a first node and the drain of the first transistor; a second inductive element coupled between the first node and the drain of the second transistor; a third transistor having a drain coupled to the drain of the first transistor and having a source coupled to a second node; and a fourth transistor having a drain coupled to the drain of the second transistor and having a source coupled to the second node.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
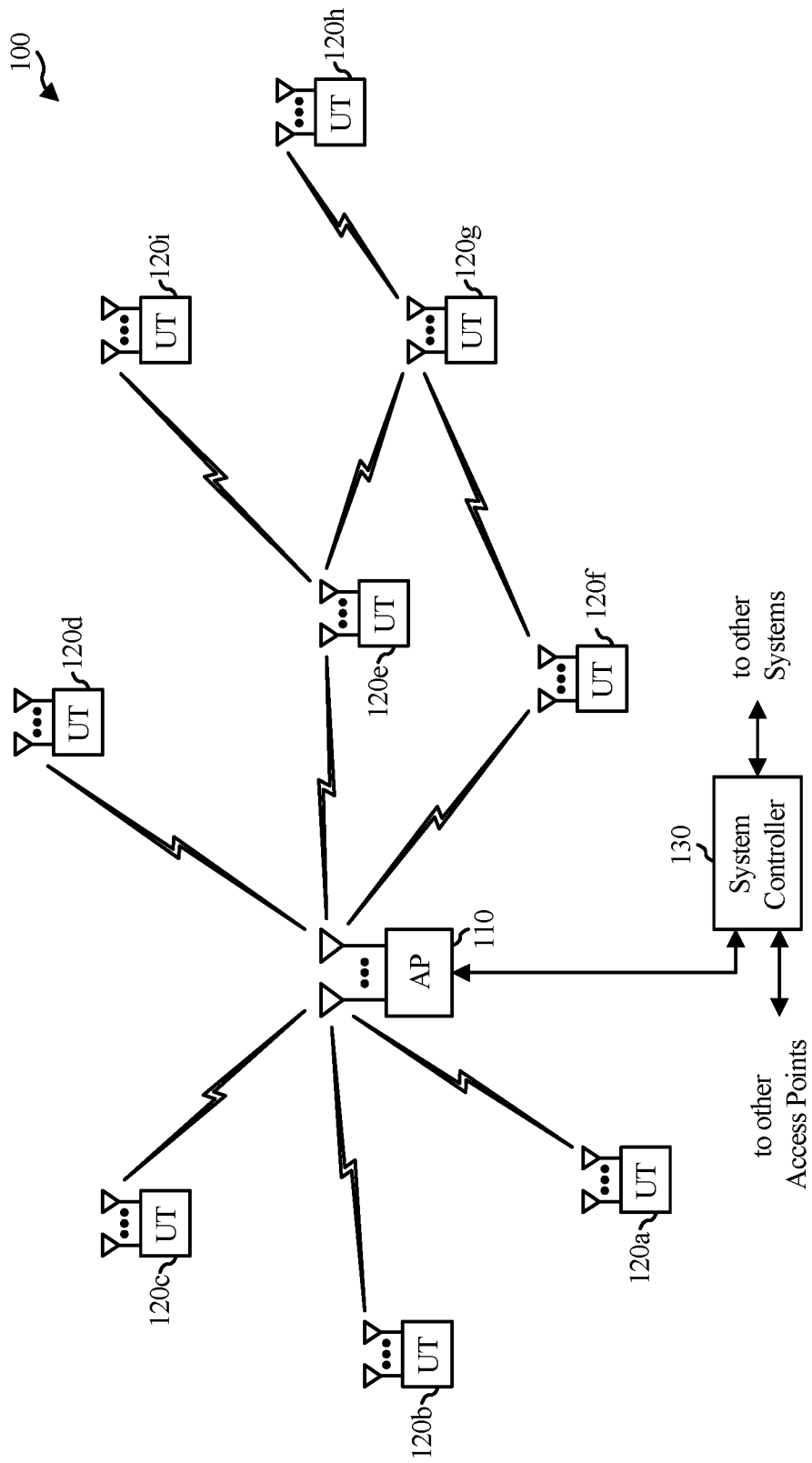
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions.

Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a circuit for generating multiple oscillating signals (e.g., a quadrature voltage-controlled oscillator (QVCO), as described in more detail herein.

Figure 2:
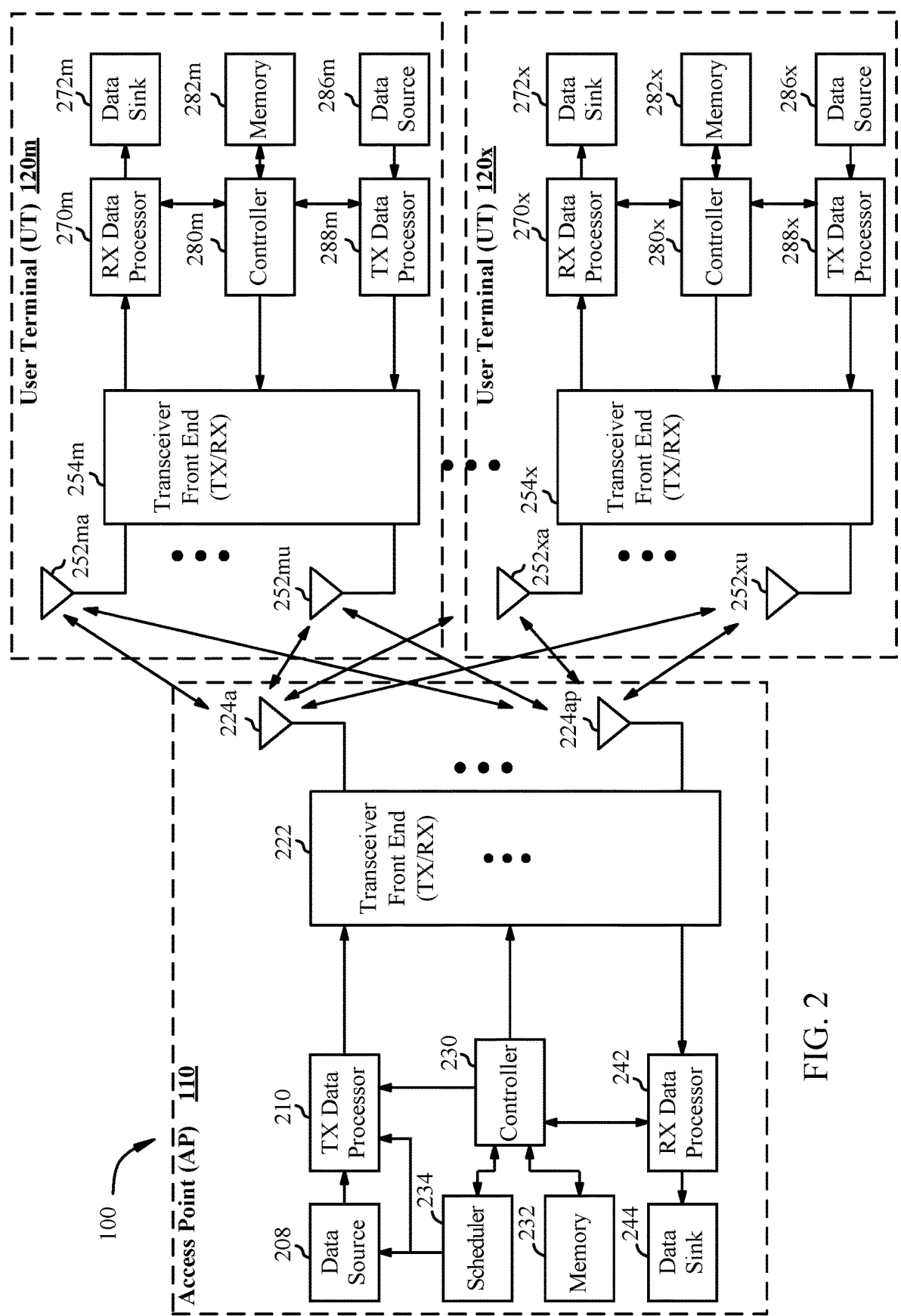
FIG. 2 is a block diagram of an example access point (AP) and example user terminals, in which aspects of the present disclosure may be practiced.

FIG. 2 shows a block diagram of access point 110 and two user terminals 120*m* and 120*x* in wireless system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224*a* through 224*ap* receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

In certain aspects, the transceiver front end (TX/RX) 222 of access point 110 and/or the transceiver front end 254 of user terminal 120 may include one or more frequency synthesizers to generate oscillating signals used for signal transmission and/or reception. At least one of the frequency synthesizers may include a circuit for generating multiple oscillating signals (e.g., a QVCO), as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
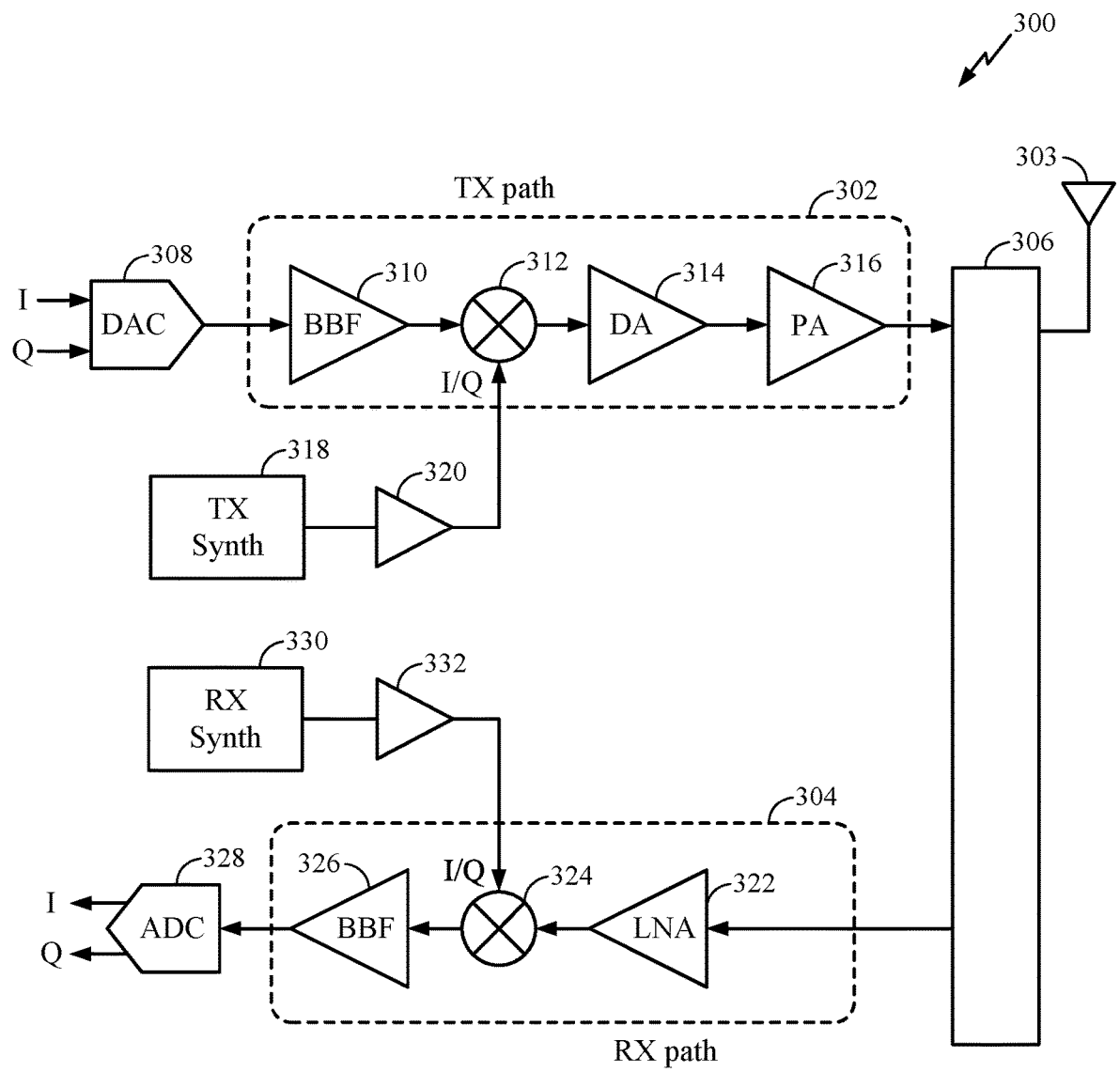
FIG. 3 is a block diagram of an example transceiver circuit, in which aspects of the present disclosure may be practiced.

FIG. 3 is a block diagram of an example transceiver circuit 300, such as transceiver front ends 222, 254 in FIG. 2, in which aspects of the present disclosure may be practiced. The transceiver circuit 300 includes at least one transmit (TX) path 302 (also known as a "transmit chain") for transmitting signals via one or more antennas and at least one receive (RX) path 304 (also known as a "receive chain") for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in one or more radio frequency integrated circuits (RFICs). The PA 316 may be external to the RFIC(s) for some implementations.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies of the LO frequency and the frequency of the signal of interest. The sum and difference frequencies are referred to as "beat frequencies." The beat frequencies may be in the RF range, such that the signals output by the mixer 312 may be RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

The RX path 304 includes a low noise amplifier (LNA) 322, a mixer 324, and a baseband filter (BBF) 326. The LNA 322, the mixer 324, and the BBF 326 may be included in one or more RFICs, which may or may not be the same RFIC(s) that include the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Certain transceivers may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects, the TX frequency synthesizer 318 and/or the RX frequency synthesizer 330 may include a circuit for generating multiple oscillating signals (e.g., a QVCO), as described in more detail herein.

While FIGS. 1-3 provide a wireless communication system as an example application in which certain aspects of the present disclosure may be implemented to facilitate understanding, certain aspects described herein may be used for generating oscillating signals in any of various other suitable systems.

An Example VCO with Improved Phase Noise and Quadrature Imbalance Trade-Off

As mentioned above, quadrature local oscillation may be utilized to drive mixers in in-phase/quadrature (IQ)-based radios. In such cases, the accuracy of the quadrature signals, and the method by which the quadrature signals are generated, may be design concerns.

One method of quadrature generation (e.g., the "frequency-division approach") includes operating a voltage-controlled oscillator (VCO) at double a chosen frequency, and performing frequency division, either in the digital or in the analog domain, to obtain quadrature signals (e.g., I/Q local oscillator (LO) signals) at the chosen frequency. The frequency-division approach may reduce pushing/pulling effects on the VCO that may be caused by a strong signal from the power amplifier (PA) (e.g., PA 316) in the transmit chain (e.g., TX path 302) of a fully integrated transceiver. As a drawback, however, a higher VCO oscillation frequency and the frequency-dividing circuitry result in increased power consumption.

Quadrature signals can also be obtained by feeding the differential outputs of the VCO to a polyphase filter, which may be realized as a resistor-capacitor (RC) polyphase filter. However, this approach may consume substantial power and may suffer from poor phase noise (PN) performance. Additionally, situations in which the VCO operates with wide bandwidth may call for higher-order polyphase filters and tunability. Hybrid couplers and ring oscillators have also been utilized to obtain quadrature. However, hybrid couplers are generally large and difficult to integrate, and ring oscillators generally suffer from poor PN performance.

Figure 4:
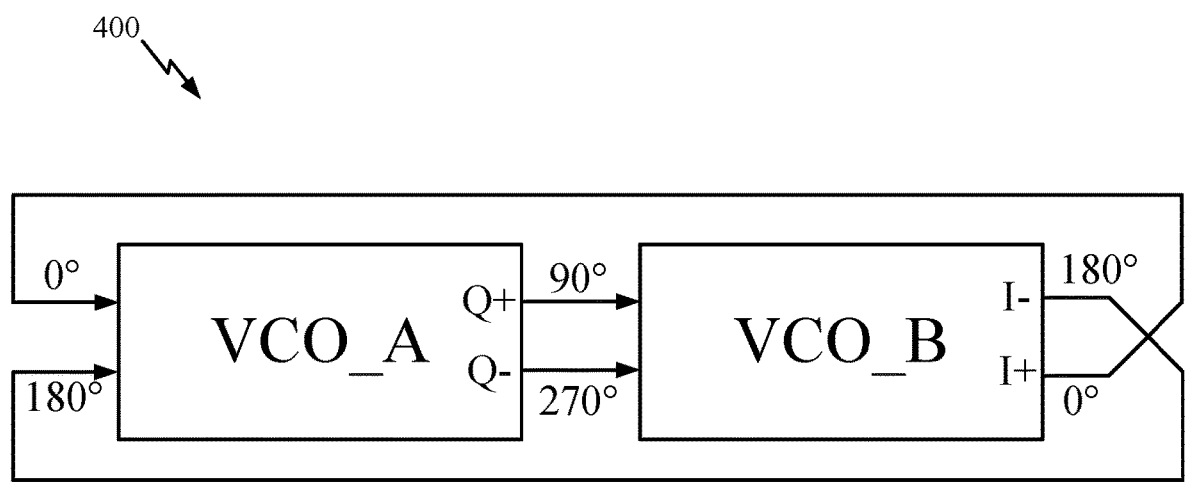
FIG. 4 is a block diagram of an example quadrature voltage-controlled oscillator (QVCO), in which aspects of the present disclosure may be practiced.

Quadrature signals may also be obtained by utilizing quadrature VCOs (QVCOs). FIG. 4 is a block diagram of an example QVCO 400, in which aspects of the present disclosure may be practiced. As shown, the QVCO 400 may include two VCO circuits (labeled "VCO_A" and "VCO_B" in FIG. 4), where the differential output of one VCO circuit is used to bias the other VCO circuit. The two VCO circuits may be implemented as inductor-capacitor (LC) tank resonators. The QVCO 400 may have a direct connection (e.g., between the output of VCO_A and the input of VCO_B) and a "cross" or "inverting" connection (e.g., between the output of VCO_B and the input of VCO_A). The combination of the direct connection and the cross connection causes VCO_A and VCO_B to oscillate in quadrature.

Two basic QVCO topologies currently exist: series-based and parallel-based. In series-based QVCOs (S-QVCOs), the bias transistors are in series with the cross-coupled transistors, whereas in parallel-based QVCOs (P-QVCOs), the bias transistors are in parallel with the cross-coupled transistors. Quadrature error in S-QVCOs generally depends on mismatch (e.g., of the transistors and/or the capacitors) and is unrelated to phase noise. Although quadrature accuracy in S-QVCOs may be improved by implementing the circuit over a large area, area restrictions may limit quadrature improvement. S-QVCOs also involve relatively large voltage headroom. On the other hand, P-QVCOs have a tradeoff between quadrature error and phase noise. P-QVCOs are capable of delivering four quadrature signals (e.g., Q+, Q−, I+, and I− as shown in FIG. 4) with low phase and amplitude errors, but may suffer from poor phase noise performance because the bias point of the bias transistors may not be programmable.

Each VCO circuit in a P-QVCO generally includes two bias transistors (also referred to as "coupling transistors") coupled in parallel with two cross-coupled transistors (also referred to as "switch transistors"). The bias transistors may be biased at the quiescent point of the cross-coupled transistors. Accordingly, the gate-to-source voltage (Vgs) of the bias transistors may oscillate across the bias point (e.g., 220 mV) of the cross-coupled transistors. In such cases, the bias transistors may be "ON" for half of the cycle (when the voltage Q+ swings high), and may be weakly ON during the remaining half of the cycle. While ON (even weakly ON), the bias transistors may contribute phase noise. The phase noise that each bias transistor contributes increases as Vgs increases. Therefore, it may be desirable to bias the bias transistors around a lower voltage (e.g., 0 mV).

Certain aspects of the present disclosure provide VCO topologies with p-type bias transistors coupled across the inductive element(s). As a result, the bias point of the bias transistors may be equal (or at least be close to) the direct current (DC) voltage drop across the inductive element(s) of the resonant circuit, which may be equal (or at least be close to) 0 mV. Accordingly, by reducing the Vgs of the bias transistors, the phase noise contributed by the bias transistors is reduced.

Figure 5A:
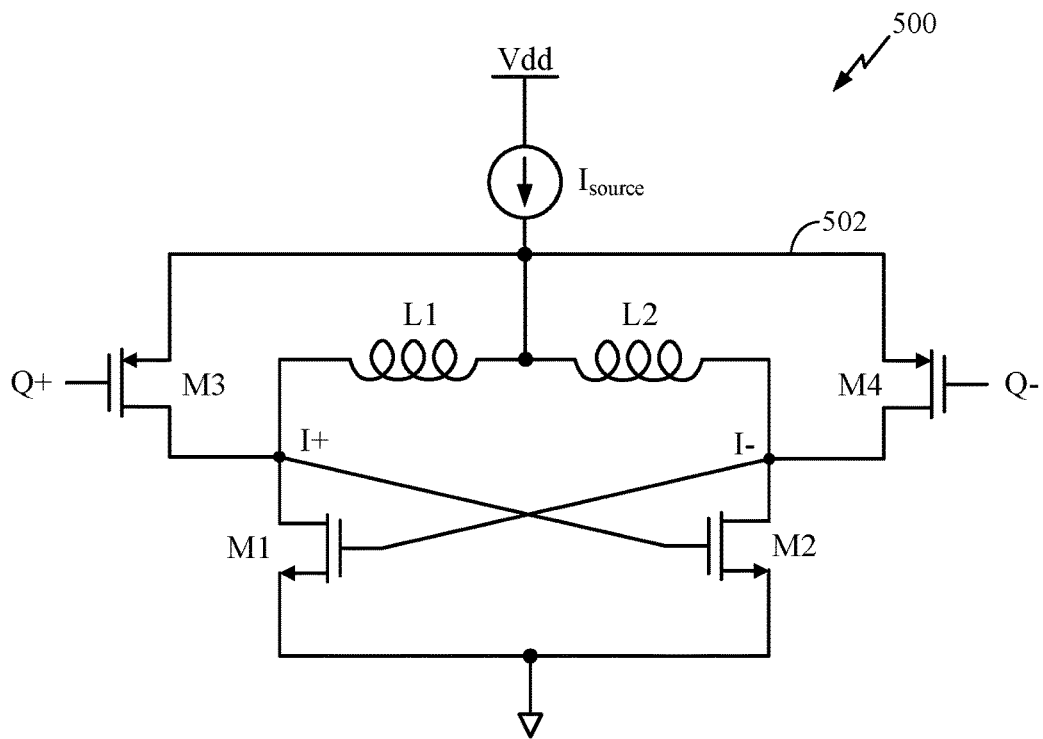
FIG. 5A is a schematic diagram of an example VCO circuit for a QVCO, in accordance with certain aspects of the present disclosure.

FIG. 5A is a circuit diagram illustrating an example VCO circuit 500 for a QVCO, in accordance with certain aspects of the present disclosure. The VCO circuit 500 may include a first transistor M1 and a second transistor M1 which are cross-coupled, a first inductive element L1, a second inductive element L2, a third transistor M3, and a fourth transistor M4.

The first transistor M1 may have a gate coupled to a drain of the second transistor M2, and the second transistor M2 may have a gate coupled to a drain of the first transistor M1. Thus, transistors M1 and M2 are the cross-coupled transistors of the VCO circuit 500. According to certain aspects, the first transistor M1 and the second transistor M2 may be n-type transistors.

The first inductive element L1 may be coupled between a node 502 and the drain of the first transistor M1, and the second inductive element L2 may be coupled between the node 502 and the drain of the second transistor M2. In some cases, the first inductive element L1 and the second inductive element L2 may be part of a center-tapped inductive element. The node 502 may be a tap of the center-tapped inductive element. A source of the first transistor M1 and a source of the second transistor M2 may be coupled to a reference potential node (e.g., electrical ground), as shown.

For certain aspects, the third transistor M3 (a bias transistor) may have a drain coupled to the drain of the first transistor M1 and a source coupled to the node 502. In some cases, the fourth transistor M4 (another bias transistor) may have a drain coupled to the drain of the second transistor M2 and a source coupled to the node 502. For certain aspects, the third transistor M3 and the fourth transistor M4 may be p-type transistors, as shown.

The VCO circuit 500 may have a differential bias input (e.g., across the gates of the third transistor M3 and the fourth transistor M4 with input signals labeled "Q+" and "Q−" for positive quadrature and negative quadrature components, respectively) and a differential output (e.g., across the drains of the first transistor M1 and the second transistor M2 with output signals labeled "I+" and "I−" for positive in-phase and negative in-phase components, respectively). As shown, the VCO circuit 500 may also include a current source $I_{source}$ coupled between a power supply rail Vdd and the node 502.

The topology of the VCO circuit 500 (with the bias transistors M3 and M4 being arranged as shown) may provide improved phase noise performance compared to the VCO circuits in S-QVCO and P-QVCO topologies. However, in situations where the VCO circuit 500 is operating at low power levels, the gate-to-source voltage (Vgs) of the bias transistors (e.g., the third transistor M3 and the fourth transistor M4) may decrease. The reduced Vgs may cause the bias transistors to become decoupled from bias transistors of another VCO circuit (not shown in FIG. 5A), resulting in a loss of quadrature. Accordingly, it may be desirable to adjust the Vgs of the bias transistors to control the trade-off between phase noise and quadrature performance while the VCO circuit operates at low power levels.

Figure 5B:
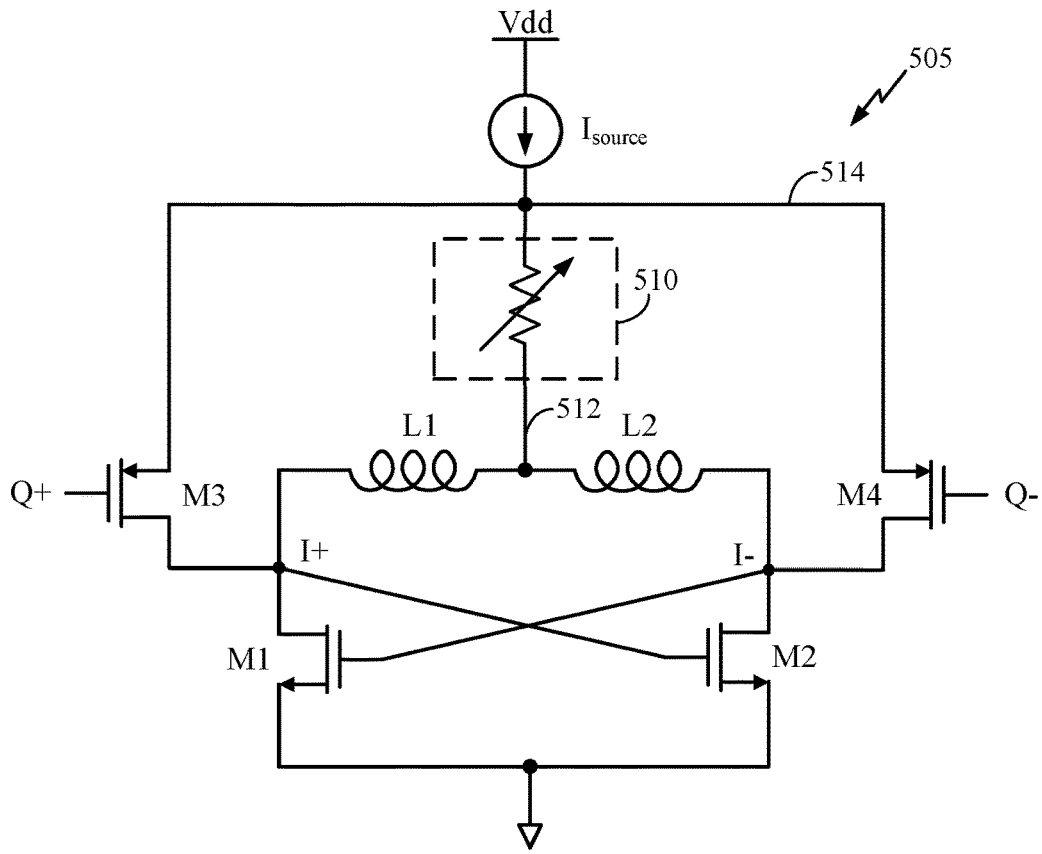
FIG. 5B is a schematic diagram of an example VCO circuit with an optional impedance for a QVCO, in accordance with certain aspects of the present disclosure.

FIG. 5B is a circuit diagram illustrating an example VCO circuit 505, in accordance with certain aspects of the present disclosure. The VCO circuit 505 of FIG. 5B is similar to the VCO circuit 500 of FIG. 5A, but also includes an impedance 510 coupled between a first node 512 and a second node 514. The impedance 510 may be implemented by a resistive element as shown or any other suitable component(s). The impedance 510 may be fixed or tunable (e.g., a tunable resistive element, as shown). The first node 512 may be coupled to the inductive elements L1 and L2 (or the tap of a center-tapped inductive element), and the second node 514 may be coupled to the current source $I_{source}$ and the sources of the bias transistors M3 and M4.

The impedance 510 may allow the Vgs of the third transistor M3 and the fourth transistor M4 to be set to a particular value and may be utilized to control the tradeoff between phase noise and quadrature performance. In other words, the impedance 510 may allow the bias point of the coupling transistors to be programmed so that quadrature is not lost in cases where the VCO circuit 505 is operating at low power levels.

In some cases, VCO circuits 500 and 505 may include one or more varactors and/or one or more capacitors coupled between the drain of the first transistor M1 and the drain of the second transistor M2 (e.g., across the inductive elements L1 and L2). For clarity, varactors and capacitors have been removed from the VCO circuits 500 and 505 in FIGS. 5A and 5B. However, example VCO circuits with a network 602 of varactors and capacitors are shown in FIG. 6.

Figure 6:
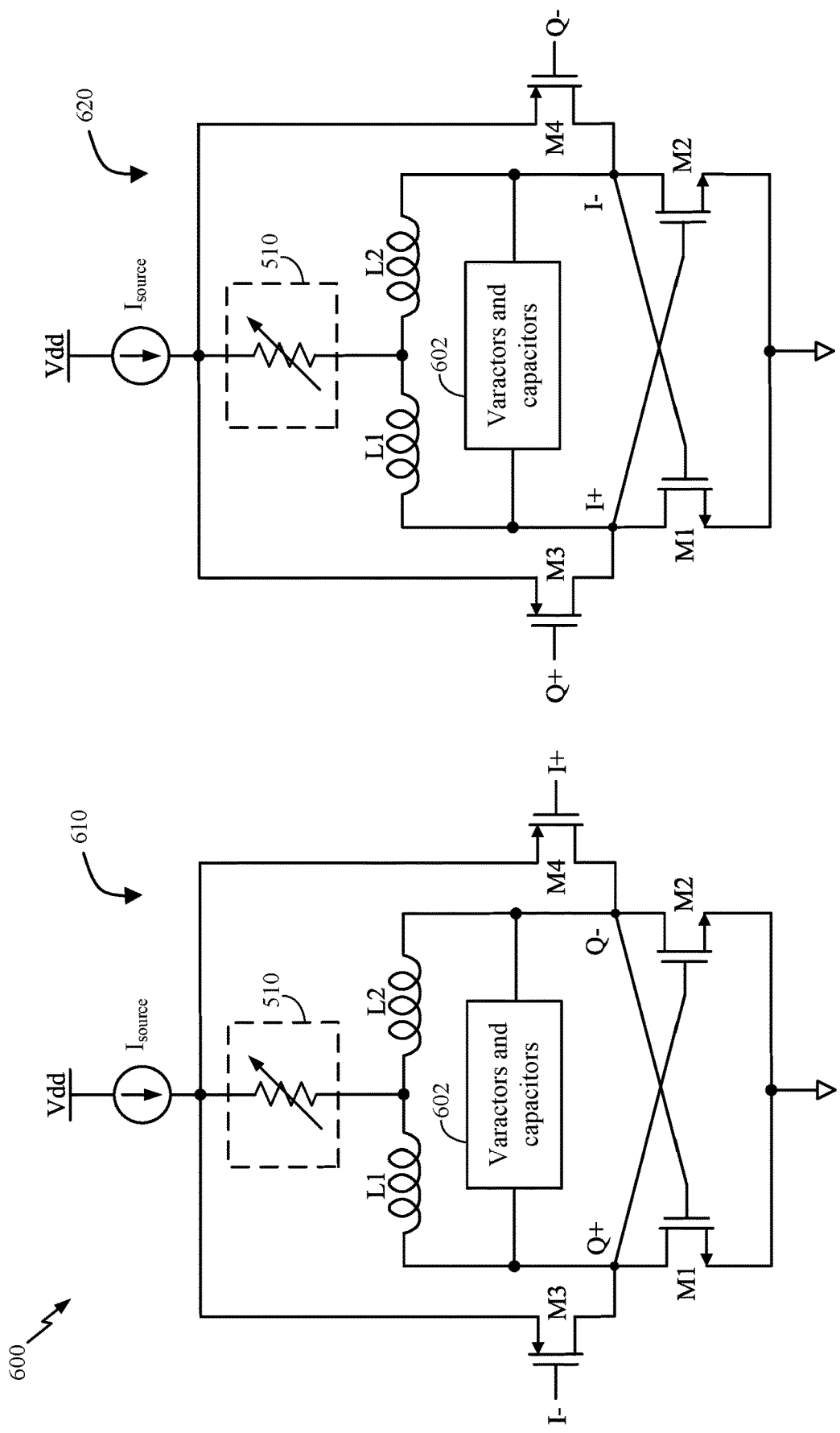
FIG. 6 is a schematic diagram of an example QVCO, in accordance with certain aspects of the present disclosure.

FIG. 6 is a circuit diagram illustrating an example QVCO circuit 600, which includes a first VCO circuit 610 and a second VCO circuit 620, in accordance with certain aspects of the present disclosure. According to certain aspects, each of the VCO circuits 610 and 620 may be similar to the VCO circuit 500 or 505 of FIGS. 5A and 5B, but with each VCO circuit having different differential bias signals and different differential output signals than the other.

In certain aspects, a differential output signal (e.g., at the drains of the first transistor M1 and the second transistor M2 with output signals labeled "I+" and "I−") of the second VCO circuit 620 may be cross-coupled to a differential bias input (e.g., at the gates of the third transistor M3 and the fourth transistor M4 with input signals labeled "I−" and "I+") of the first VCO circuit 610. Furthermore, a differential output signal (e.g., at the drains of the first transistor M1 and the second transistor M2 with output signals labeled "Q+" and "Q−") of the first VCO circuit 610 may be coupled to a differential bias input (e.g., at the gates of the third transistor M3 and the fourth transistor M4 with input signals labeled "Q+" and "Q−") of the second VCO circuit 610, as shown.

Therefore, the drain of the first transistor M1 and the drain of the second transistor M2 of the first VCO circuit 610 may be coupled to the differential output (with output signals labeled "Q+" and "Q−") of the first VCO circuit 610. In some cases, a gate of the third transistor M3 of the first VCO circuit 610 may be coupled to a negative output (e.g., with the output signal labeled "I−") of the differential output of the second VCO circuit 620, and a gate of the fourth transistor M4 of the first VCO circuit 610 may be coupled to a positive output (e.g., with the output signal labeled "I+") of the differential output of the second VCO circuit 620. Similarly, the drain of the first transistor M1 and the drain of the second transistor M2 of the second VCO circuit 620 may be coupled to the differential output (with output signals labeled "I+" and "I−") of the second VCO circuit 620. In certain aspects, a gate of the third transistor M3 of the second VCO circuit 620 may be coupled to a positive output (e.g., with the output signal labeled "Q+") of the differential output of the first VCO circuit 610, and a gate of the fourth transistor M4 of the second VCO circuit 620 may be coupled to a negative output (e.g., with the output signal labeled "Q−") of the differential output of the first VCO circuit 610. Sources of the first transistor M1 and the second transistor M2 may be coupled to a reference potential node (e.g., electrical ground).

In certain aspects, the differential bias input of the first VCO circuit 610 may be configured to receive an in-phase differential signal (e.g., "I+" and "I−"), wherein the first VCO circuit 610 is configured to generate a quadrature differential signal (e.g., "Q+" and "Q−") on the differential output of the first VCO circuit 610. In some cases, the second VCO circuit 620 may be configured to receive the quadrature differential signal on the differential bias input of the second VCO circuit 620 and to generate a complementary in-phase differential signal on the differential output of the second VCO circuit 620.

At least one of the first VCO circuit 610 or the second VCO circuit 620 may include a plurality of varactors and/or a plurality of capacitors coupled between the drain of the first transistor M1 and the drain of the second transistor M2, as illustrated by the networks 602 in both the first VCO circuit 610 and the second VCO circuit 620. A voltage applied to the plurality of varactors may be adjusted so as to adjust a frequency of an output oscillating signal of the VCO circuit.

Example Operations for Generating a Plurality of Oscillating Signals

Figure 7:
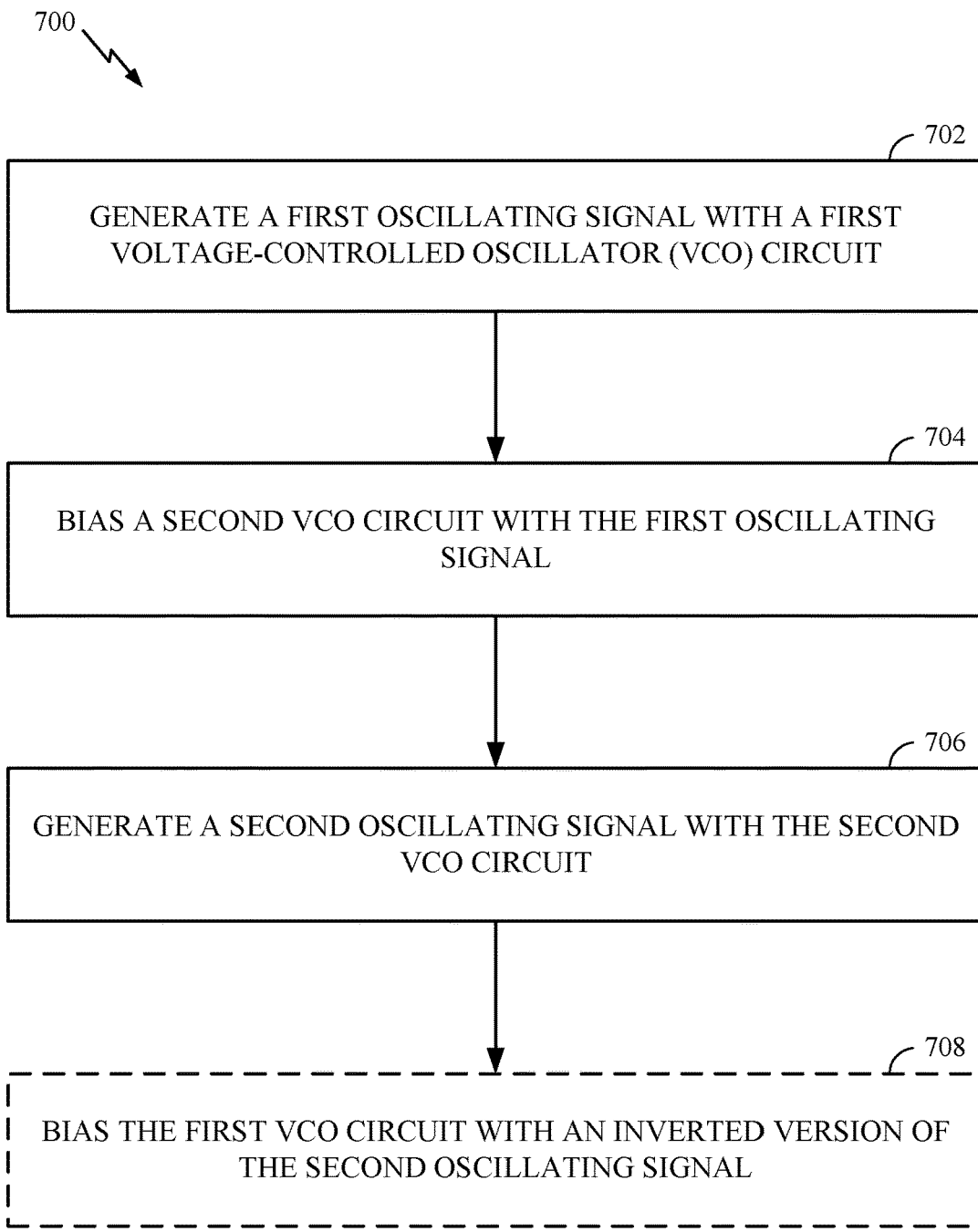
FIG. 7 is a flow diagram illustrating example operations for generating a plurality of oscillating signals, in accordance with certain aspects of the present disclosure.

FIG. 7 is a flow diagram illustrating example operations 700 for generating a plurality of oscillating signals, in accordance with certain aspects of the present disclosure. The operations 700 may be performed by a circuit having a multiple VCO circuits, such as the QVCO circuit 600.

The operations 700 may begin, at block 702, with a first VCO circuit (e.g., VCO circuit 610) generating a first oscillating signal (e.g., "Q+" and "Q−"). At block 704, the circuit may bias a second VCO circuit (e.g., VCO circuit 620) with the first oscillating signal. At block 706, the second VCO circuit may generate a second oscillating signal (e.g., "I−" and "I+").

At least one of the first VCO circuit or the second VCO circuit may include a pair of cross-coupled transistors comprising a first transistor (e.g., transistor M1) and a second transistor (e.g., transistor M2), wherein the first transistor has a gate coupled to a drain of the second transistor and wherein the second transistor has a gate coupled to a drain of the first transistor, a first inductive element (e.g., inductive element L1) coupled between a first node (e.g., node 502 or node 512) and the drain of the first transistor, a second inductive element (e.g., inductive element L2) coupled between the first node and the drain of the second transistor, a third transistor (e.g., transistor M3) having a drain coupled to the drain of the first transistor and having a source coupled to a second node (e.g., node 502 or node 514), and a fourth transistor (e.g., transistor M4) having a drain coupled to the drain of the second transistor and having a source coupled to the second node.

In certain aspects, the operations 700 may optionally involve, at block 708, biasing the first VCO circuit with an inverted version of the second oscillating signal. The inverted version of the second oscillating signal may be an in-phase differential signal (e.g., "I+" and "I−"), wherein the first oscillating signal may be a quadrature differential signal (e.g., "Q+" and "Q−"), and wherein the second oscillating signal may be a complementary in-phase differential signal (e.g., "I−" and "I+").

In certain aspects, the operations 700 may also include tuning a resistive element (e.g., impedance 510 with a tunable resistance) coupled between the first node and the second node. For other aspects, the first node and the second node of the at least one of the first VCO circuit or the second VCO circuit may be shorted together (e.g., to form a single node 502 as shown in FIG. 5A).

In certain aspects, the first transistor and the second transistor may be n-type transistors. In this case, the third transistor and the fourth transistor may be p-type transistors.

In certain aspects, the operations 700 may include adjusting a voltage applied to a plurality of varactors (e.g., varactors in the network 602 of varactors and/or capacitors) to adjust a frequency of at least one of the first oscillating signal or the second oscillating signal. The plurality of varactors may be coupled between the drain of the first transistor and the drain of the second transistor in the at least one of the first VCO circuit or the second VCO circuit, respectively.

EXAMPLE ASPECTS

In addition to the various aspects described above, specific combinations of aspects are within the scope of the disclosure, some of which are detailed below:

Aspect 1: A circuit for generating oscillating signals, comprising: a first voltage-controlled oscillator (VCO) circuit; and a second VCO circuit having a differential bias input coupled to a differential output of the first VCO circuit, at least one of the first VCO circuit or the second VCO circuit comprising: a pair of cross-coupled transistors comprising a first transistor and a second transistor, wherein the first transistor has a gate coupled to a drain of the second transistor and wherein the second transistor has a gate coupled to a drain of the first transistor; a first inductive element coupled between a first node and the drain of the first transistor; a second inductive element coupled between the first node and the drain of the second transistor; a third transistor having a drain coupled to the drain of the first transistor and having a source coupled to a second node; and a fourth transistor having a drain coupled to the drain of the second transistor and having a source coupled to the second node.

Aspect 2: The circuit of Aspect 1, further comprising a resistive element coupled between the first node and the second node.

Aspect 3: The circuit of Aspect 2, wherein the resistive element is tunable.

Aspect 4: The circuit of any of the preceding Aspects, wherein the third transistor and the fourth transistor are p-type transistors.

Aspect 5: The circuit of Aspect 4, wherein the first transistor and the second transistor are n-type transistors.

Aspect 6: The circuit of any of the preceding Aspects, wherein a differential output of the second VCO circuit is cross-coupled to a differential bias input of the first VCO circuit.

Aspect 7: The circuit of Aspect 6, wherein: the drain of the first transistor and the drain of the second transistor are coupled to the differential output of the first VCO circuit; a gate of the third transistor is coupled to a negative output of the differential output of the second VCO circuit; and a gate of the fourth transistor is coupled to a positive output of the differential output of the second VCO circuit.

Aspect 8: The circuit of Aspect 6 or 7, wherein: the drain of the first transistor and the drain of the second transistor are coupled to the differential output of the second VCO circuit; a gate of the third transistor is coupled to a positive output of the differential output of the first VCO circuit; and a gate of the fourth transistor is coupled to a negative output of the differential output of the first VCO circuit.

Aspect 9: The circuit of any of Aspects 6 to 8, wherein the differential bias input of the first VCO circuit is configured to receive an in-phase differential signal, wherein the first VCO circuit is configured to generate a quadrature differential signal on the differential output of the first VCO circuit, and wherein the second VCO circuit is configured to receive the quadrature differential signal on the differential bias input of the second VCO circuit and to generate a complementary in-phase differential signal on the differential output of the second VCO circuit.

Aspect 10: The circuit of any of the preceding Aspects, further comprising: a current source coupled between a power supply rail and the second node; and a plurality of varactors coupled between the drain of the first transistor and the drain of the second transistor, wherein sources of the first transistor and the second transistor are coupled to a reference potential node.

Aspect 11: The circuit of any of the preceding Aspects, wherein the first inductive element and the second inductive element are part of a center-tapped inductive element and wherein the first node is a tap of the center-tapped inductive element.

Aspect 12: A method for generating a plurality of oscillating signals, comprising: generating a first oscillating signal with a first voltage-controlled oscillator (VCO) circuit; biasing a second VCO circuit with the first oscillating signal; and generating a second oscillating signal with the second VCO circuit, at least one of the first VCO circuit or the second VCO circuit comprising: a pair of cross-coupled transistors comprising a first transistor and a second transistor, wherein the first transistor has a gate coupled to a drain of the second transistor and wherein the second transistor has a gate coupled to a drain of the first transistor; a first inductive element coupled between a first node and the drain of the first transistor; a second inductive element coupled between the first node and the drain of the second transistor; a third transistor having a drain coupled to the drain of the first transistor and having a source coupled to a second node; and a fourth transistor having a drain coupled to the drain of the second transistor and having a source coupled to the second node.

Aspect 13: The method of Aspect 12, further comprising tuning a resistive element coupled between the first node and the second node.

Aspect 14: The method of Aspect 12 or 13, further comprising biasing the first VCO circuit with an inverted version of the second oscillating signal.

Aspect 15: The method of Aspect 14, wherein the inverted version of the second oscillating signal is an in-phase differential signal, wherein the first oscillating signal is a quadrature differential signal, and wherein the second oscillating signal is a complementary in-phase differential signal.

Aspect 16: The method of any of Aspects 12 to 15, wherein the first transistor and the second transistor are n-type transistors and wherein the third transistor and the fourth transistor are p-type transistors.

Aspect 17: The method of any of Aspects 12 to 16, further comprising adjusting a voltage applied to a plurality of varactors to adjust a frequency of at least one of the first oscillating signal or the second oscillating signal, respectively, the plurality of varactors being coupled between the drain of the first transistor and the drain of the second transistor in the at least one of the first VCO circuit or the second VCO circuit.

Additional Considerations

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A circuit for generating oscillating signals, comprising:
a first voltage-controlled oscillator (VCO) circuit; and
a second VCO circuit having a differential bias input coupled to a differential output of the first VCO circuit, at least one of the first VCO circuit or the second VCO circuit comprising:
a pair of cross-coupled transistors comprising a first transistor and a second transistor, wherein the first transistor has a gate coupled to a drain of the second transistor and wherein the second transistor has a gate coupled to a drain of the first transistor;
a first inductive element coupled between a first node and the drain of the first transistor;
a second inductive element coupled between the first node and the drain of the second transistor;
a third transistor having a drain coupled to the drain of the first transistor and having a source coupled to a second node; and
a fourth transistor having a drain coupled to the drain of the second transistor and having a source coupled to the second node, wherein the third transistor and the fourth transistor are p-type transistors.

2. The circuit of claim 1, further comprising a resistive element coupled between the first node and the second node.

3. The circuit of claim 2, wherein the resistive element is tunable.

4. The circuit of claim 1, wherein the first transistor and the second transistor are n-type transistors.

5. The circuit of claim 1, wherein a differential output of the second VCO circuit is cross-coupled to a differential bias input of the first VCO circuit.

6. The circuit of claim 5, wherein:
the drain of the first transistor and the drain of the second transistor are coupled to the differential output of the first VCO circuit;
a gate of the third transistor is coupled to a negative output of the differential output of the second VCO circuit; and
a gate of the fourth transistor is coupled to a positive output of the differential output of the second VCO circuit.

7. The circuit of claim 5, wherein:
the drain of the first transistor and the drain of the second transistor are coupled to the differential output of the second VCO circuit;
a gate of the third transistor is coupled to a positive output of the differential output of the first VCO circuit; and
a gate of the fourth transistor is coupled to a negative output of the differential output of the first VCO circuit.

8. The circuit of claim 5, wherein the differential bias input of the first VCO circuit is configured to receive an in-phase differential signal, wherein the first VCO circuit is configured to generate a quadrature differential signal on the differential output of the first VCO circuit, and wherein the second VCO circuit is configured to receive the quadrature differential signal on the differential bias input of the second VCO circuit and to generate a complementary in-phase differential signal on the differential output of the second VCO circuit.

9. The circuit of claim 1, further comprising:
a current source coupled between a power supply rail and the second node; and
a plurality of varactors coupled between the drain of the first transistor and the drain of the second transistor, wherein sources of the first transistor and the second transistor are coupled to a reference potential node.

10. The circuit of claim 1, wherein the first inductive element and the second inductive element are part of a center-tapped inductive element and wherein the first node is a tap of the center-tapped inductive element.

11. A method for generating a plurality of oscillating signals, comprising:
generating a first oscillating signal with a first voltage-controlled oscillator (VCO) circuit;
biasing a second VCO circuit with the first oscillating signal; and generating a second oscillating signal with the second VCO circuit, at least one of the first VCO circuit or the second VCO circuit comprising:
- a pair of cross-coupled transistors comprising a first transistor and a second transistor, wherein the first transistor has a gate coupled to a drain of the second transistor and wherein the second transistor has a gate coupled to a drain of the first transistor;
- a first inductive element coupled between a first node and the drain of the first transistor;
- a second inductive element coupled between the first node and the drain of the second transistor;
- a third transistor having a drain coupled to the drain of the first transistor and having a source coupled to a second node; and
- a fourth transistor having a drain coupled to the drain of the second transistor and having a source coupled to the second node, wherein the third transistor and the fourth transistor are p-type transistors.

12. The method of claim 11, further comprising tuning a resistive element coupled between the first node and the second node.

13. The method of claim 11, further comprising biasing the first VCO circuit with an inverted version of the second oscillating signal.

14. The method of claim 13, wherein the inverted version of the second oscillating signal is an in-phase differential signal, wherein the first oscillating signal is a quadrature differential signal, and wherein the second oscillating signal is a complementary in-phase differential signal.

15. The method of claim 11, wherein the first transistor and the second transistor are n-type transistors.

16. The method of claim 11, further comprising adjusting a voltage applied to a plurality of varactors to adjust a frequency of at least one of the first oscillating signal or the second oscillating signal, respectively, the plurality of varactors being coupled between the drain of the first transistor and the drain of the second transistor in the at least one of the first VCO circuit or the second VCO circuit.

\* \* \* \* \*